US012191863B2

(12) United States Patent
Ma (10) Patent No.: US 12,191,863 B2
(45) Date of Patent: Jan. 7, 2025

(54) APPARATUSES AND METHODS FOR DUTY CYCLE ADJUSTMENT (71) Applicant: MICRON TECHNOLOGY, INC., Boise, ID (US)

(72) Inventor: Yantao Ma, Boise, ID (US)

(*) Notice: Subject to any disclaimer, the term of this patent is extended or adjusted under 35 U.S.C. 154(b) by 45 days.

(21) Appl. No.: 15/956,601

(22) Filed: Apr. 18, 2018

(65) Prior Publication Data
US 2018/0241383 A1 Aug. 23, 2018

Related U.S. Application Data (63) Continuation of application No. 13/670,222, filed on Nov. 6, 2012, now Pat. No. 9,954,517.

(51) Int. Cl.
*H03K 5/156* (2006.01)
(52) U.S. Cl.
CPC ................ *H03K 5/1565* (2013.01)
(58) Field of Classification Search
CPC ........ H03K 5/1565; H03K 5/06; H03K 5/065; H03K 5/05; H03K 5/07; H03K 5/1508; H03K 5/1506; H03K 5/15066; H03K 5/133; H03K 5/134; H03K 2005/00065; H03K 2005/00052; H03L 7/087; H03L 7/0814; H03L 7/0818
See application file for complete search history.

(56) References Cited

U.S. PATENT DOCUMENTS

| 5,727,037 | A | 3/1998 | Maneatis |
| 5,757,218 | A * | 5/1998 | Blum ................ H03K 5/05 327/172 |
| 5,923,613 | A | 7/1999 | Tien et al. |
| 5,940,609 | A | 8/1999 | Harrison |
| 6,281,725 | B1 | 8/2001 | Hanzawa et al. |
| 6,342,801 | B1 | 1/2002 | Shin |
| 6,388,480 | B1 | 5/2002 | Stubbs et al. |
| 6,452,432 | B2 | 9/2002 | Kim |
| 6,483,359 | B2 | 11/2002 | Lee |
| 6,489,823 | B2 | 12/2002 | Iwamoto |
| 6,498,512 | B2 | 12/2002 | Simon et al. |
| 6,518,807 | B1 | 2/2003 | Cho |
| 6,518,809 | B1 | 2/2003 | Kotra |
| 6,549,041 | B2 | 4/2003 | Waldrop |
| 6,573,771 | B2 | 6/2003 | Lee et al. |

(Continued)

OTHER PUBLICATIONS

Kuo-Hsing, et al., "A High Linearity, Fast-locking Pulsewidth Control Loop with Digitally Programmable Duty Cycle Correction for Wide Range Operation", Solid-State Circuits, vol. 43, Issue 2, Feb. 2008, 399-413.

(Continued)

*Primary Examiner* — Patrick C Chen
(74) *Attorney, Agent, or Firm* — Dorsey & Whitney LLP (57) ABSTRACT

Apparatuses, duty cycle adjustment circuits, adjustment circuits, and methods for duty cycle adjustment are disclosed herein. An example duty cycle adjustment circuit may be configured to receive a signal and adjust a duty cycle of the signal a first amount using a coarse adjustment. The duty cycle adjustment circuit may further be configured, after adjusting the duty cycle of the signal a first amount, to adjust the duty cycle of the signal a second amount different from the first amount using a fine adjustment to provide a duty cycle adjusted signal.

17 Claims, 8 Drawing Sheets

(56) References Cited

U.S. PATENT DOCUMENTS

| | | |
|---|---|---|
| 6,583,657 B1 | 6/2003 | Eckhardt et al. |
| 6,603,339 B2 | 8/2003 | Atallah et al. |
| 6,605,969 B2 | 8/2003 | Mikhalev et al. |
| 6,650,190 B2 | 11/2003 | Jordan et al. |
| 6,653,876 B2 | 11/2003 | Issa et al. |
| 6,677,792 B2 | 1/2004 | Kwak |
| 6,680,635 B2 | 1/2004 | Lee |
| 6,703,879 B2 | 3/2004 | Okuda et al. |
| 6,765,421 B2 | 7/2004 | Brox et al. |
| 6,774,690 B2 | 8/2004 | Baker et al. |
| 6,788,120 B1 | 9/2004 | Nguyen |
| 6,853,225 B2 | 2/2005 | Lee |
| 6,853,226 B2 | 2/2005 | Kwak et al. |
| 6,859,081 B2 | 2/2005 | Hong et al. |
| 6,917,229 B2 | 7/2005 | Cho |
| 6,934,215 B2 | 8/2005 | Chung et al. |
| 6,940,328 B2 * | 9/2005 | Lin .................. H03K 5/1565 |
| | | 327/172 |
| 6,967,514 B2 | 11/2005 | Kizer et al. |
| 7,116,143 B2 | 10/2006 | Deivasigamani et al. |
| 7,120,839 B2 | 10/2006 | Fayneh et al. |
| 7,208,989 B2 | 4/2007 | Gomm et al. |
| 7,250,798 B2 | 7/2007 | Gomm et al. |
| 7,423,467 B1 | 9/2008 | Simon |
| 7,515,669 B2 | 4/2009 | Shiah et al. |
| 7,570,094 B2 | 8/2009 | Winich |
| 7,705,649 B1 | 4/2010 | Yu et al. |
| 7,830,186 B2 * | 11/2010 | Yun .................. H03L 7/0818 |
| | | 327/158 |
| 7,839,192 B1 | 11/2010 | Wang |
| 7,990,194 B2 | 8/2011 | Shim |
| 8,154,331 B2 | 4/2012 | Kim et al. |
| 8,933,738 B2 * | 1/2015 | Wu .................. H03K 5/1565 |
| | | 327/175 |
| 9,413,338 B2 | 8/2016 | Ma |
| 2001/0026183 A1 | 10/2001 | Kim |
| 2003/0099321 A1 | 5/2003 | Juan et al. |
| 2004/0008064 A1 | 1/2004 | Kashiwazaki |
| 2004/0012428 A1 | 1/2004 | Yee et al. |
| 2004/0027182 A1 | 2/2004 | Brox et al. |
| 2004/0066873 A1 | 4/2004 | Cho et al. |
| 2004/0150447 A1 * | 8/2004 | Chang .................. H03K 5/1506 |
| | | 327/175 |
| 2004/0155686 A1 | 8/2004 | Kim et al. |
| 2004/0178835 A1 | 9/2004 | Kim |
| 2004/0189364 A1 | 9/2004 | Lee et al. |
| 2006/0145745 A1 | 7/2006 | Gomm et al. |
| 2006/0202732 A1 | 9/2006 | Deivasigamani et al. |
| 2006/0209320 A1 | 9/2006 | Gomm et al. |
| 2007/0252631 A1 | 11/2007 | Kaviani et al. |
| 2008/0191767 A1 | 8/2008 | Koo |
| 2009/0058483 A1 | 3/2009 | Shin et al. |
| 2009/0108896 A1 * | 4/2009 | Yasuda .................. H03K 3/0375 |
| | | 327/202 |
| 2009/0289679 A1 | 11/2009 | Kuroki et al. |
| 2010/0085094 A1 * | 4/2010 | Ma .................. G06F 1/06 |
| | | 327/158 |
| 2011/0110412 A1 | 5/2011 | Shin |
| 2011/0163789 A1 * | 7/2011 | Na .................. H03K 5/1565 |
| | | 327/175 |
| 2011/0248752 A1 | 10/2011 | Willey et al. |
| 2013/0229216 A1 * | 9/2013 | Wu .................. H03K 5/06 |
| | | 327/175 |
| 2013/0249611 A1 * | 9/2013 | Vandepas .................. H03L 1/02 |
| | | 327/159 |
| 2013/0307631 A1 * | 11/2013 | Lotfy .................. H03K 3/0315 |
| | | 331/34 |
| 2014/0125390 A1 | 5/2014 | Ma |
| 2015/0002201 A1 | 1/2015 | Kitagawa et al. |
| 2015/0341021 A1 | 11/2015 | Ma |

OTHER PUBLICATIONS

Tatsuya, et al., "A 1-Bv/s/pin 512-Mb DDRII SDRAM Using a Digital DLL and a Slew-Rate-Controlled Output Buffer", IEEE Journal of Solid- State Circuits, vol. 38, No. 5, May 2003, 762-768.

Yi-Ming, et al., "An all-digital 50% duty-cycle corrector", Circuits and Systems, vol. 2, ISCAS '04. Proceedings of the 2004 International Symposium, May 2004, 925-928.

* cited by examiner

APPARATUSES AND METHODS FOR DUTY CYCLE ADJUSTMENT

CROSS-REFERENCE TO RELATED APPLICATION

This application is a continuation of U.S. patent application Ser. No. 13/670,222, issued as U.S. Pat. No. 9,954,517 on Apr. 24, 2018, filed Nov. 6, 2012. These application and patent are incorporated by reference herein in their entirety and for all purposes.

TECHNICAL FIELD

Embodiments of the present invention relate generally to semiconductor memory, and more specifically, in one or more described embodiments, adjusting signal duty cycles.

BACKGROUND

As system clock speeds continue to rise, signal reliability and accuracy have become increasingly important, particularly with respect to amplitude, frequency, and distortion. Providing signals with robust duty cycles has also been desirable, as many digital circuits require a precisely controlled duty cycle for proper operation. In some cases, circuits are configured to operate on both rising and falling edges of clocks, further emphasizing the importance of maintaining a consistently accurate duty cycle for a clock signal.

Known approaches for maintaining a reliable duty cycle corrected clock signal have failed with respect to accuracy, as many systems are capable of reliably correcting a duty cycle, but only for a few specific duty cycles (e.g., 50% duty cycle). Response times and ranges of known approaches have also failed to meet increasing demands. Many implementations are unable to correct duty cycles of signals having high duty cycle variation and/or are limited by the amount a duty cycle may be adjusted.

DETAILED DESCRIPTION

Apparatuses and methods for duty cycle adjustment are disclosed herein. Certain details are set forth below to provide a sufficient understanding of embodiments of the invention. However, it will be clear to one having skill in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
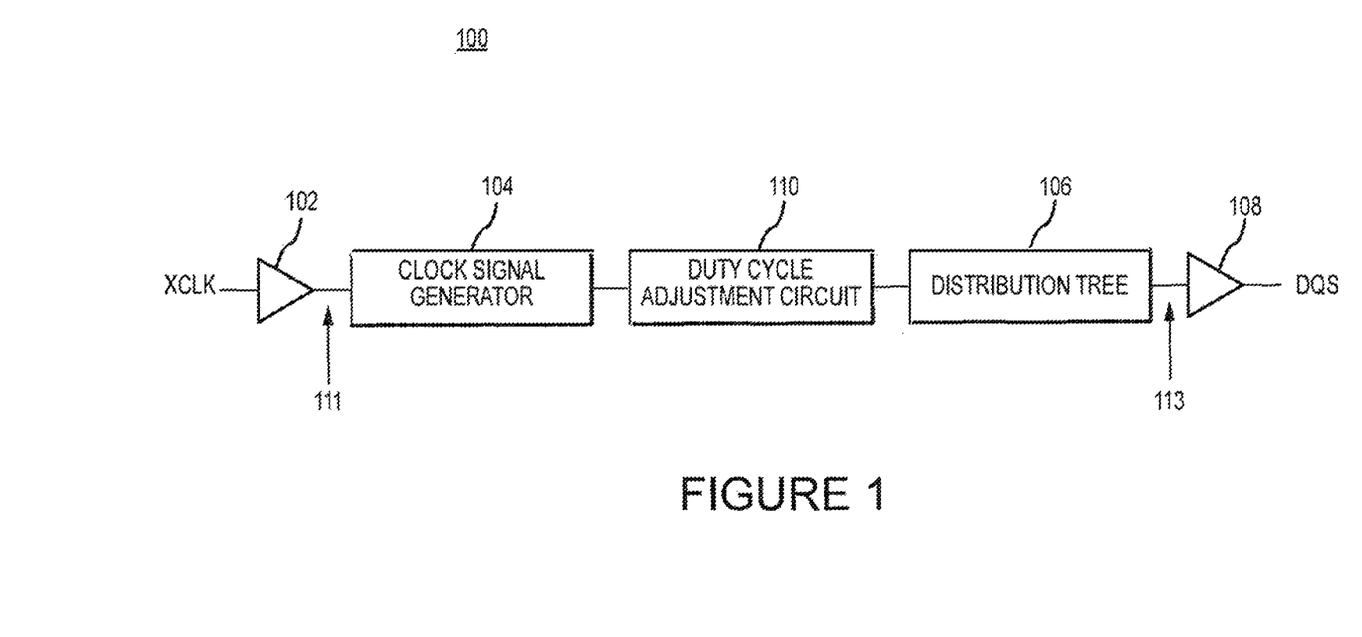
FIG. 1 is a block diagram of an apparatus according to an embodiment of the invention.

FIG. 1 is a schematic block diagram of an apparatus 100 according to an embodiment of the invention. As used herein, the term apparatus may refer to, but is not limited to, for example, a device(s), a system(s), a chip(s), a chip package(s), a drive(s), a die (dice), or any combination or subcombination of the same. The apparatus 100 may include an input buffer 102, a clock signal generator 104, a distribution tree 106, an output buffer 108 and a duty cycle adjustment circuit 110. The input buffer 102 may be any buffer known in the art and may be coupled to the clock signal generator 104. The input buffer 102 may be configured to receive a clock signal XCLK and provide the buffered XCLK signal to the clock signal generator 104. The XCLK signal may, for instance, be an external clock signal, and may provide to the input buffer 102 by a device such as a memory controller or oscillator.

The clock signal generator 104 may be any clock signal generator known in the art, such as a clock signal generator having a delay locked loop, and further may be coupled to the duty cycle adjustment circuit 110. The clock signal generator 104 may be configured to delay the buffered XCLK signal, for instance, using coarse and/or fine delays. For example, the clock signal generator 104 may be configured to delay the buffered XCLK signal with delays of varying duration. The clock signal generator 104 may be configured to delay the buffered XCLK signal in accordance with one or more control signals provided, for instance, from a controller (e.g. control logic). In one embodiment, delaying the buffered XCLK signal in this manner may, for instance, synchronize an internal clock signal (not shown) with the XCLK signal and/or convert the XCLK signal to a different clock domain.

The duty cycle adjustment circuit 110 may be configured to receive the delayed XCLK signal from the clock signal generator 104 and adjust the duty cycle of the delayed XCLK signal to provide a duty cycle adjusted clock signal DCCCLK. Duty cycle distortion of the delayed XCLK signal may have been present in the XCLK signal, and/or introduced by propagation of the XCLK signal through the input buffer 102 and clock signal generator 104, for example. In at least one embodiment, the duty cycle adjustment circuit 110 may be configured to adjust the duty cycle of the delayed XCLK signal such that the DCCCLK signal has approximately a particular desired duty cycle, such as a 40% duty cycle, a 50% duty cycle, or a 60% duty cycle. In other embodiments, the clock signal DCCCLK may be provided with any other duty cycle. The duty cycle adjustment circuit 110 may further be configured to adjust the duty cycle of the delayed XCLK signal in real-time.

The distribution tree 106 may be coupled to the duty cycle adjustment circuit 110 and may be configured to receive the DCCCLK signal therefrom. The distribution tree 106 may be used to distribute the DCCCLK signal to one or more circuits that rely on DCCCLK signal to operate, such as the output buffer 108. The output buffer 108 may be any buffer known in the art and may be coupled to the distribution tree 106. The output buffer 108 may receive the distributed DCCCLK signal and provide the distributed DCCCLK signal to one or more circuits as a data strobe signal DQS.

The DQS signal may be used as a strobe signal with which write data may be captured, for instance, by control logic and/or a memory array (not shown in FIG. 1). The DCCCLK signal may also be used to clock an output buffer (not shown) to provide output data according to the DCCCLK signal.

In an example operation of the apparatus 100, the XCLK signal may be provided to the input buffer 102. The input buffer 102 may in turn provide the buffered XCLK signal to the clock signal generator 104 which may in turn delay the buffered XCLK signal. As described, the clock signal generator 104 may delay the buffered XCLK signal such that an internal clock signal is synchronized with the XCLK signal, and/or converted to another clock domain.

As previously discussed, the duty cycle adjustment circuit 110 may receive the delayed XCLK signal and adjust the duty cycle of the delayed XCLK signal to provide a duty cycle adjusted clock signal DCCCLK. The duty cycle of the delayed XCLK signal may be adjusted by the duty cycle adjustment circuit 110 such that the clock signal DCCCLK has a particular desired duty cycle, such as 50%. As will be explained in more detail below, in one embodiment, the duty cycle adjustment circuit 110 may be configured to adjust the duty cycle of the delayed XCLK signal using coarse adjustments and/or fine adjustments. For example, the duty cycle adjustment circuit 110 may adjust the duty cycle of the delayed XCLK signal by adjusting rising and falling times of the clock signal XCLK. In this manner, the duty cycle of the delayed XCLK signal may be adjusted until a particular desired duty cycle is achieved.

While the duty cycle adjustment circuit 110 has been described herein as being coupled to the clock signal generator 104 and the distribution tree 106, it will be appreciated by those having ordinary skill in the art that in other embodiments, the duty cycle adjustment circuit 110 may be included at different locations in the apparatus 100. By way of example, the duty cycle adjustment circuit 110 may be coupled to the input buffer 102 and the clock signal generator 104 at location 111. In this instance, the duty cycle adjustment circuit 110 may be configured to receive the buffered XCLK signal from the input buffer 102 and provide a duty cycle adjusted clock signal DCCCLK to the clock signal generator 104. As another example, the duty cycle adjustment circuit 110 may be coupled to the distribution tree 106 and the output buffer 108 at location 113. In this instance, the duty cycle adjustment circuit 110 may be configured to receive a distributed XCLK signal and provide a duty cycle adjusted clock signal DCCCLK to the output buffer 108. In yet another example, the duty cycle adjustment circuit 110 may be included in the input buffer 102.

Figure 2:
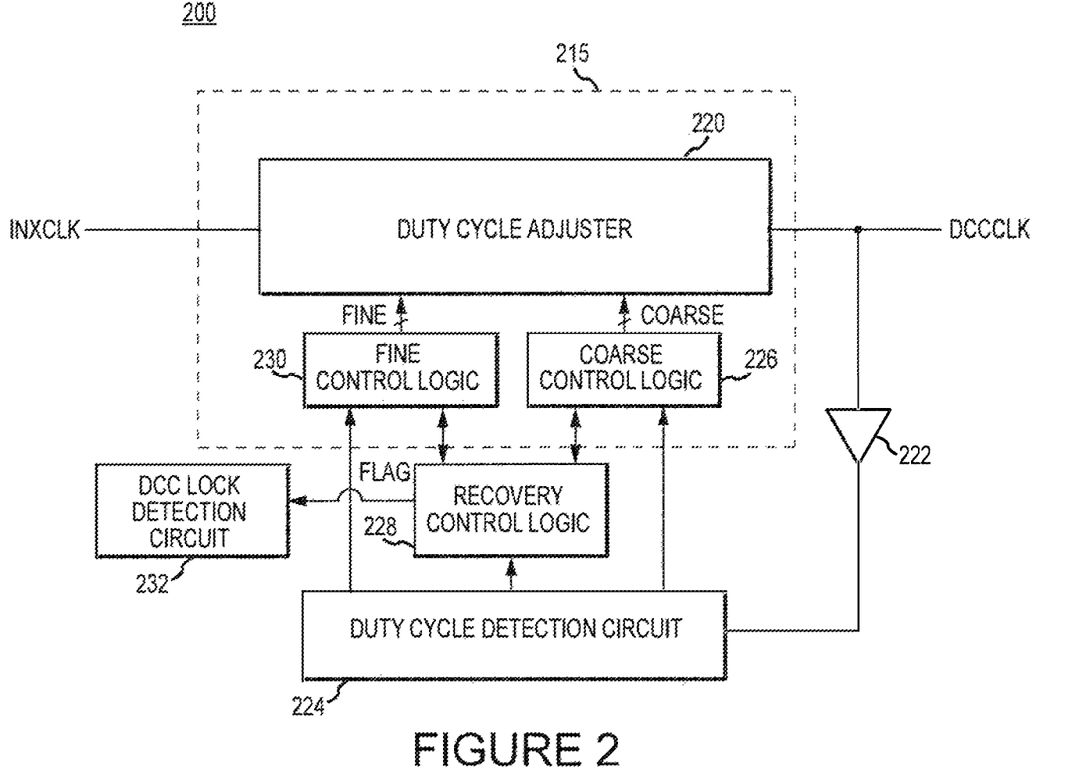
FIG. 2 is a block diagram of a duty cycle adjustment circuit according to an embodiment.

FIG. 2 is a schematic block diagram of a duty cycle adjustment circuit 200 according to an embodiment. The duty cycle adjustment circuit 200 may be used to implement the duty cycle adjustment circuit 110 of FIG. 1. The duty cycle adjustment circuit 200 may include an adjustment circuit 215, an output buffer delay model 222, a duty cycle detection circuit 224, a recovery control logic 228, and a duty cycle lock detection circuit 232.

The adjustment circuit 215 may include a duty cycle adjuster 220, a coarse control logic 226, and a fine control logic 230. The duty cycle adjustor 220 may be configured to receive a clock signal INXCLK and may adjust the duty cycle of the INXCLK signal to provide a duty cycle adjusted clock signal DCCCLK, as described above. The duty cycle adjustor 220 may be coupled to the coarse control logic 226 and the fine control logic 230, and may be configured to adjust the duty cycle of the INXCLK signal based, at least in part, on one or more control signals received from the coarse control logic 226 and/or the fine control logic 230. As used herein, the phrase "based at least in part" may encompass, but is not limited to the phrase "responsive, at least in part". By way of example, and as will be explained in more detail below, the coarse control logic 226 may be configured to provide one or more control signals COARSE to the duty cycle adjuster 220. Based, at least in part, on the one or more COARSE control signals, the duty cycle adjuster 220 may increase or decrease the duty cycle of the clock signal XCLK by a coarse (e.g., relatively large) amount. Additionally or alternatively, the fine control logic 230 may similarly be configured to provide one or more control signals FINE to the duty cycle adjuster 220. Based, at least in part, on the one or more FINE control signals, the duty cycle adjuster 220, may increase or decrease the duty cycle of the INXCLK signal by a fine (e.g. relatively small) amount. In one embodiment, multiple fine adjustments may have a magnitude approximately equal to the magnitude of a coarse adjustment. In another embodiment, the fine adjustment range, i.e., from the minimum to the maximum number of available fine adjustments, may be equal to a coarse adjustment, or may be smaller or larger than a coarse adjustment. For instance, the fine adjustment range may be equivalent to approximately 1.2 coarse adjustments. In yet another embodiment, one or more of the coarse adjustments may adjust the duty cycle by a different amount.

The output buffer delay model 222 may be coupled to the duty cycle adjuster 220 of the adjustment circuit 215 and may receive the DCCCLK. The output buffer delay model 222 may be configured to provide a delay to the DCCCLK signal that models an inherent propagation delay of an output buffer, such as the output buffer 108 of FIG. 1. Delaying DCCCLK in this manner may, for instance, may allow the duty cycle adjustment circuit 200 to adjust the duty cycle of the INXCLK signal in a manner that accounts for delays and/or duty cycle distortion incurred from the output buffer 108.

The duty cycle detection circuit 224 may be configured to receive the delayed DCCCLK signal from the output buffer model delay 222 and detect duty cycle error in the clock signal DCCCLK. The duty cycle detection circuit 224 may provide control signals to the recovery control logic 228, the coarse control logic 226, and/or the fine control logic 230 indicating detection of duty cycle error in the clock signal DCCCLK.

The recovery control logic 228 may be coupled to the duty cycle detection circuit 224, the coarse control logic 226, the fine control logic 230, and the duty cycle lock detection circuit 232. Responsive to the control signals from the duty cycle detection circuit 224 indicating the detection of duty cycle error in the DCCCLK signal, the recovery control logic 228 may determine whether the duty cycle of the DCCCLK signal satisfies a particular duty cycle threshold. For example, in one embodiment, the recovery control logic 228 may determine whether the duty cycle is within a particular duty cycle percentage range (e.g., 48%-52%), or may determine whether the duty cycle error over a period of time is within a particular range (e.g., 5% duty cycle variation) for a given frequency of the INXCLK signal.

In response to determining that the duty cycle of the clock signal DCCCLK exceeds a particular range or exceeds an acceptable duty cycle error, the recovery control logic 228 may further enable the coarse control logic 226 and/or the fine control logic 230 to adjust the duty cycle error. In at least one embodiment, the recovery control logic 228 may be configured to enable coarse and fine control logic 226, 230 individually. For example, the recovery control logic 228 may be configured to enable the coarse control logic 226 to make a relatively large duty cycle adjustment. In response to being enabled, the coarse control logic 226 may cause the duty cycle adjuster 220 to adjust the duty cycle of the INXCLK signal using one or more coarse adjustments. The duty cycle of the clock signal XCLK may be iteratively adjusted until sufficient coarse adjustments are made. In some embodiments, sufficient coarse adjustment is indicated by achieving an oscillation condition. It may be in some conditions that coarse adjustments are made until no further coarse adjustments are available. The coarse control logic 226 may indicate to the recovery control logic 228 that sufficient coarse adjustments have been made, e.g., that an oscillation condition has been achieved, and/or that no further coarse adjustments are available.

The recovery control logic 228 may be configured to enable the fine control logic 230. In response, the fine control logic 230 may cause the duty cycle adjuster 220 to adjust the duty cycle of the clock signal XCLK using fine adjustments to make relatively small duty cycle adjustments. The duty cycle of the INXCLK signal may be iteratively adjusted using fine adjustments until sufficient fine adjustments are made. In some embodiments, sufficient fine adjustment is indicated by achieving an oscillation condition. It may be in some conditions that fine adjustments are made until no further fine adjustments are available. The fine control logic 230 may indicate to the recovery control logic 228 that sufficient adjustments have been made, e.g., that an oscillation condition has been achieved, and/or no further fine adjustments are available.

In one embodiment, if both the coarse and fine control logic 226, 230 indicate that sufficient adjustments have been made, the recovery control logic 228 may provide a control signal FLAG to the DCC lock detection circuit 232. In response to the control signal FLAG, the DCC lock detection circuit 232 may provide a control signal (not shown in FIG. 2) indicating that the duty cycle of the INXCLK signal has been adjusted and locked. In response to the FLAG control signal, the DCC lock detection circuit 232 may further cause one or more components of the duty cycle adjustment circuit 200, such as the recovery control logic 228, to operate in a power saving mode.

Figure 3:
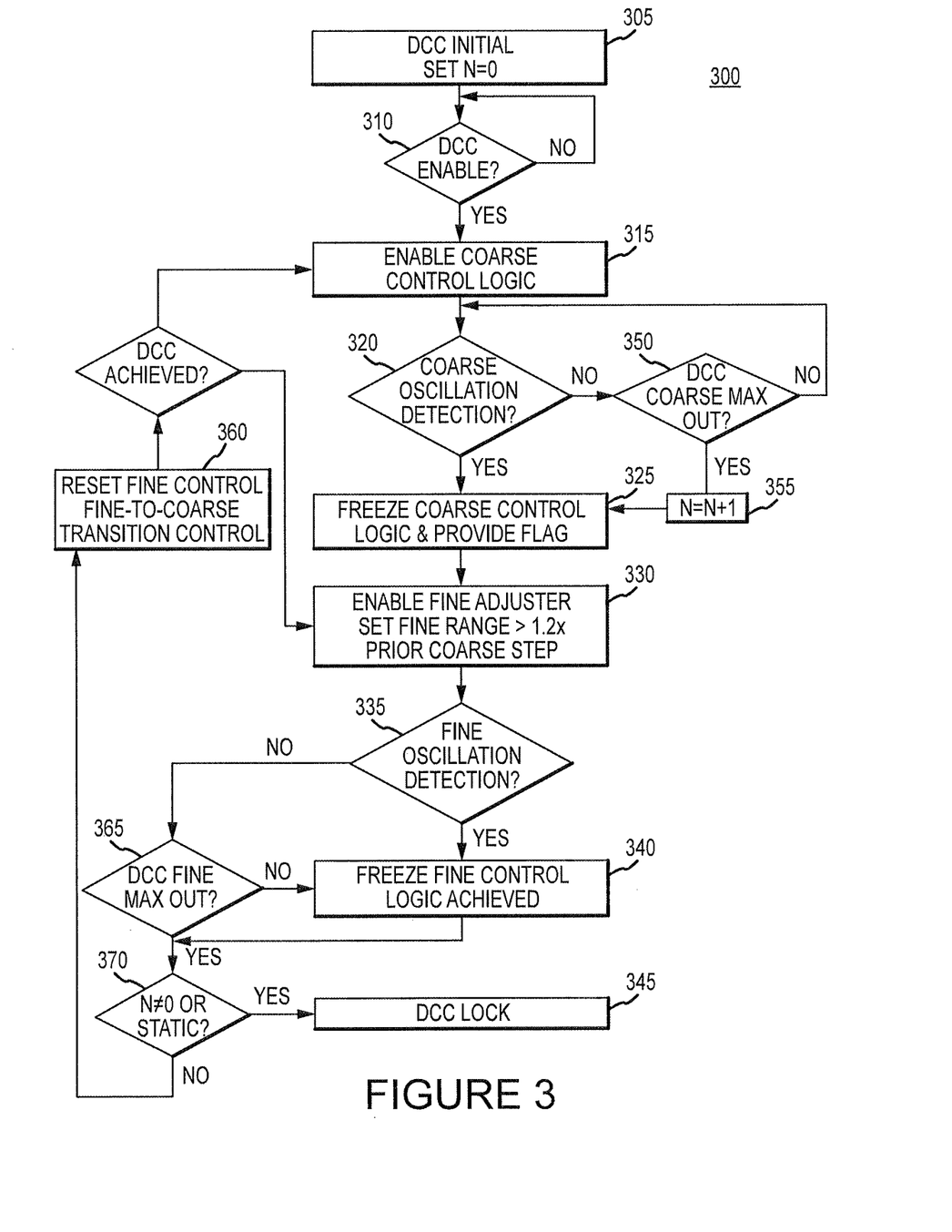
FIG. 3 is a flowchart of a method for operating a duty cycle adjustment circuit according to an embodiment of the invention.

FIG. 3 is a flowchart of a method 300 for operating a duty cycle adjustment circuit according to an embodiment of the invention. The method 300 may be implemented using one or more components of the duty cycle adjustment circuit 200 of FIG. 2. At a step 305, a duty cycle adjustment routine may be initiated and a variable N initialized at a value of 0 by the recovery control logic 228. The variable N may, for instance, represent a recovery count which, as explained in further detail below, may be used in determining whether the duty cycle of the clock signal INXCLK may be further adjusted. At a step 310, the recovery control logic 228 may determine whether duty cycle adjustment is enabled. If duty cycle adjustment is not enabled, the determination may be iteratively repeated at the step 310 until duty cycle adjustment is enabled. Whether duty cycle adjustment is enabled may be based on a control signal provided by a device, such as memory controller (not shown in FIG. 3) and/or based on the duty cycle of the INXCLK signal.

Once it has been determined that duty cycle adjustment is enabled, at a step 315, the coarse control logic 226 of FIG. 2 may be enabled by the recovery control logic 228, as described above. In response, at a step 320, the coarse control logic 226 may adjust the duty cycle of the INXCLK signal by providing one or more COARSE control signals to the duty cycle adjuster 220 of FIG. 2. If, due to adjustment of the duty cycle of the INXCLK signal, an oscillation condition is achieved, at a step 325, the coarse control logic 226 may freeze (e.g., stop) adjustment of the duty cycle of the INXCLK signal and provide an indication to the recovery control logic 228 that an oscillation condition has been achieved and that the fine control logic 230 may be enabled.

In response, at a step 330, the fine control logic 230 may be enabled by the recovery control logic 228, and the fine control logic 230 may establish a fine adjustment range. The fine adjustment range may, as described, have a magnitude equal to 1.2 coarse adjustments. In embodiments wherein the magnitude of coarse adjustments vary, the fine adjustment range may have a magnitude equal to 1.2 of the largest coarse adjustment. In some embodiments, the fine adjustment range may have a magnitude equal to 1.2 of the most recent coarse adjustment used to adjust the duty cycle of the INXCLK signal or the next available coarse adjustment used to adjust the duty cycle of the INXCLK signal. The size of the most recent coarse adjustment may, for instance, be provided to the fine control logic 230 by the recovery control logic 228 and/or the coarse control logic 226.

Once the fine control logic 230 has been enabled and/or a fine adjustment range established, the fine control logic 230 may adjust the duty cycle of the INXCLK signal by providing one or more FINE control signals to the duty cycle adjuster 220 of FIG. 2. The fine control logic 226 may adjust the duty cycle of the INXCLK signal until an oscillation condition is achieved or until no further fine adjustments are available. If an oscillation condition is achieved, at a step 340, the fine control logic 230 may freeze further fine adjustment and provide an indication to the recovery control logic 228 that an oscillation condition has been achieved, and the recovery control logic 228 may acknowledge that duty cycle adjustment has been achieved. At a step 370, the recovery control logic 228 may determine whether duty cycle adjustment is being performed in a static mode or a dynamic mode and/or whether the variable N has a value of 0 or not. If N does not equal 0, or duty cycle adjustment is being performed in a static mode, at a step 345, the recovery control logic may provide the FLAG control signal to the DCC lock detection circuit 232 indicating that a lock condition has been achieved.

If, at the step 320, an oscillation condition is not achieved, at a step 350 the coarse control logic 226 may determine whether all coarse adjustments were used in adjusting the duty cycle of the INXCLK signal. As will be described, in one embodiment, this may include having selectively enabled each of a plurality of adjuster cells, or may include having selectively disabled each of a plurality of adjuster cells. If all coarse adjustments were not used, the coarse control logic 226 may again adjust the duty cycle of the INXCLK signal at the step 320. If all coarse adjustments were used, the variable N may be incremented at a step 355. A method 400, illustrated in and described in more detail below with reference to FIG. 4, may implement the step 320 as described above.

Figure 4:
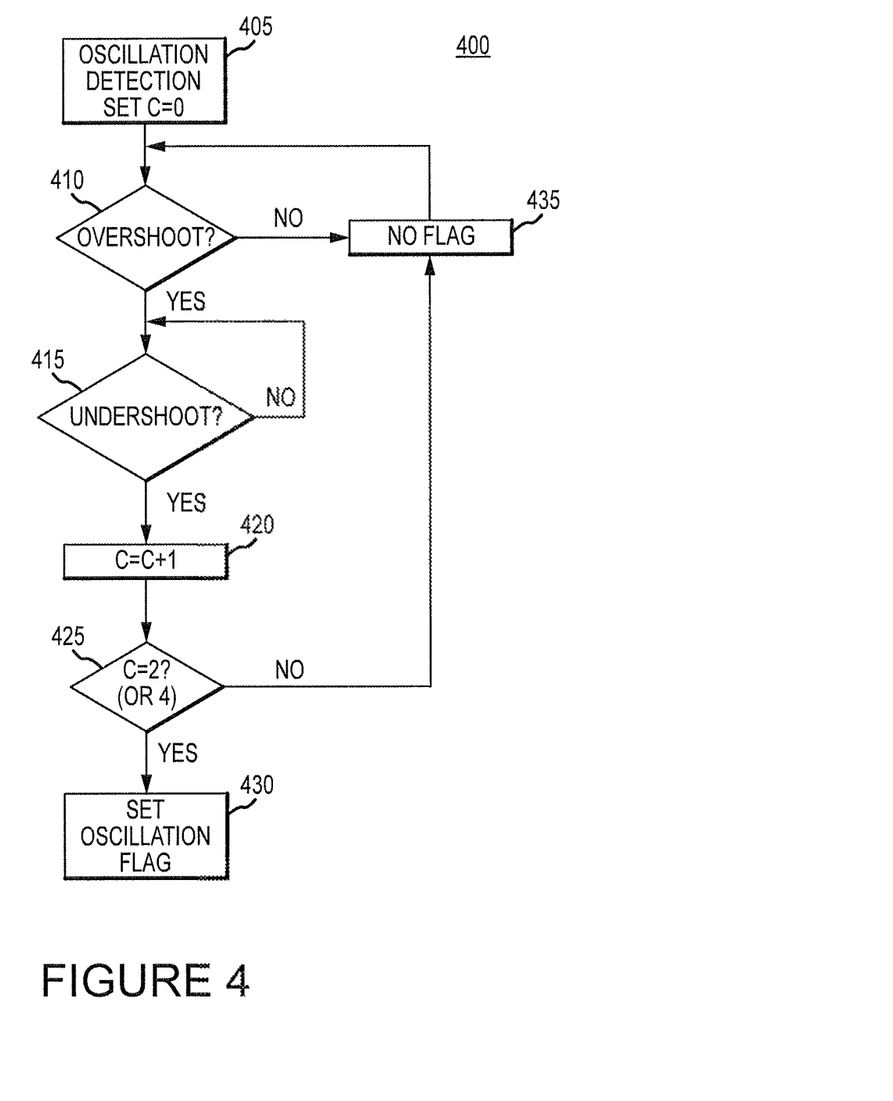
FIG. 4 is a flowchart of a method for detecting oscillation according to an embodiment of the invention.

If, at the step 335, an oscillation condition is not achieved, at the step 365 the fine control logic 230 may determine whether all fine adjustments were used in adjusting the duty cycle of the INXCLK signal. If all fine adjustments were not used, the fine control logic 230 may indicate to the recovery control logic 228 that not all fine adjustments were not used. The method 400 may implement the step 335, as described above.

If, at the step 370, N has a value of 0 and duty cycle adjustment is not being performed in a static mode, i.e., is being performed in a dynamic mode, at a step 360, the coarse control logic 226 or the fine control logic 230 may be enabled. For example, if duty cycle adjustment has not yet been achieved at the step 335, the recovery control logic 228 may enable the coarse control logic 326 at the step 315. However, if duty cycle adjustment has been achieved at the step 335 prior to implementing the step 360, the recovery control logic 228 may enable the fine control logic 230 at the step 330.

As described, a lock condition may be achieved at the step 345. In one embodiment, however, particular events may terminate the lock condition, and in response, the method 300 may be repeated by one or more components of the duty cycle adjustment circuit 200 of FIG. 2. These events may include a system reset, a change in supply voltage, a variation in temperature, a change in system clock duty cycle, a system power down, an initialization of a test mode, or a combination thereof.

FIG. 4 is a flowchart of a method 400 for detecting an oscillation condition according to an embodiment of the invention. The method 400 may be used to implement the step 320 and/or the step 335 of FIG. 3. While the following example is described with respect to implementation using the coarse control logic 226 of FIG. 2, it will be appreciated that the method 400 may be implemented by other components of the duty cycle adjustment circuit of FIG. 2, such as the fine control logic 230. At a step 405, an oscillation detection routine may be initiated and a variable C may be initialized with a value of 0. At a step 410, the duty cycle of the INXCLK signal may be adjusted (e.g., increased) by the coarse control logic 226. The coarse control logic 226 may determine whether an adjustment (e.g., increase or decrease) of the duty cycle causes the duty cycle of the INXCLK signal to overshoot (e.g., overcompensate), a particular duty cycle. If the adjustment does not cause the duty cycle of the clock signal XCLK to overshoot a particular duty cycle, at a step 435, an oscillation flag is maintained inactive (e.g., low), indicating an oscillation condition has not been achieved, and the method 400 may return to the step 410. This process may be iteratively repeated until an adjustment of the duty cycle of the INXCLK signal overshoots a desired duty cycle, or until no further coarse adjustments are available with which to overshoot a particular duty cycle. If no further coarse adjustments are available, a control signal may be provided from the coarse control logic 226, for instance, to the recovery control logic 228, indicating that no oscillation condition was achieved and that all coarse adjustments were used.

If an overshoot results, at a step 415, the duty cycle of the INXCLK signal may be adjusted (e.g., decreased) by the coarse control logic 226. The coarse control logic 226 may determine whether the adjustment of the duty cycle undershoots the particular duty cycle.

If the adjusted duty cycle of the INXCLK signal does not undershoot the desired duty cycle, the step 415 may be iteratively repeated until an undershoot is detected. If no further adjustments are available with which to undershoot, a control signal may be provided from the coarse control logic 226 to the recovery control logic 228, indicating that no oscillation condition was detected and that not all coarse adjustments were used.

If an undershoot does result, at a step 420, the variable C may be incremented, and at a step 425, the value of the variable C may be evaluated. For example, in one embodiment, if the variable C has a value of 2, at a step 430, an oscillation flag may be set active (e.g., high), thereby indicating that an oscillation condition has been achieved. If the variable C does not have the value of 2, the method 400 may return to the step 435, as described. In other embodiments, the variable C may be evaluated against any other values, such as 4 or 8. The higher the value of the variable C required to implement the step 430, the higher the reliability of detecting that an oscillation condition has been achieved, but the longer the time required to the determination.

In some embodiments, the duty cycle of the clock signal INXCLK may initially be less than a desired duty cycle. In such instances, an overshoot may include adjusting the duty cycle of the clock signal INXCLK such that the resulting duty cycle of the clock signal INXCLK is greater than the desired duty cycle, and an undershoot may include adjusting the duty cycle of the clock signal INXCLK such that the resulting duty cycle of the clock signal INXCLK is less than the desired duty cycle. In other embodiments, the duty cycle of the clock signal INXCLK may initially be greater than a desired duty cycle. In such instances, an overshoot may include adjusting the duty cycle of the clock signal INXCLK such that the resulting duty cycle of the clock signal INXCLK is less than the desired duty cycle, and an undershoot may include adjusting the duty cycle of the clock signal INXCLK such that the resulting duty cycle of the clock signal INXCLK is greater than the desired duty cycle.

Figure 5:
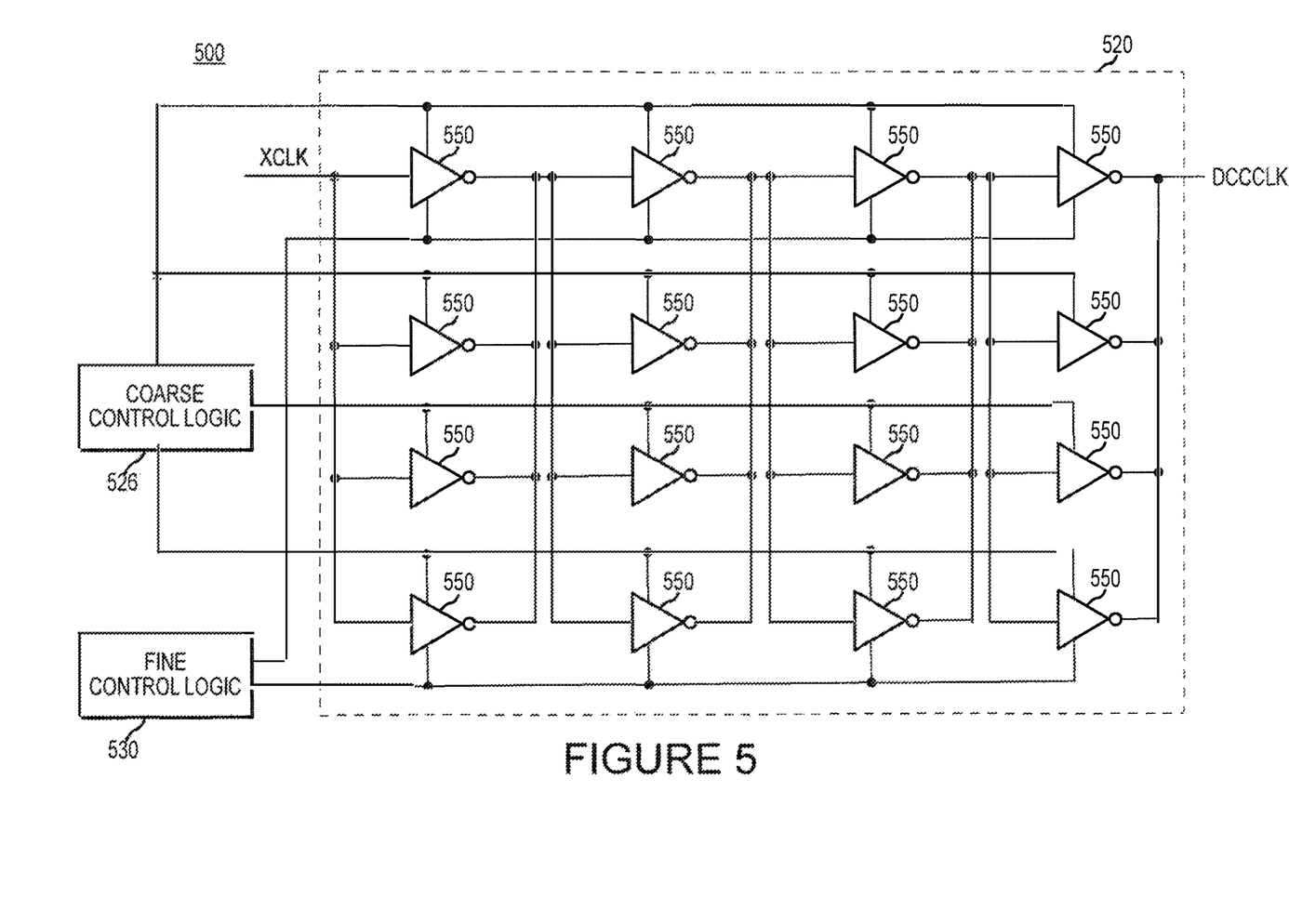
FIG. 5 is a schematic block diagram of an adjustment circuit according to an embodiment of the invention.

FIG. 5 is a schematic block diagram of an adjustment circuit 500 according to an embodiment of the invention. The adjustment circuit 500 may be used to implement the adjustment circuit 215 of FIG. 2. The adjustment circuit 500 may include a duty cycle adjuster 520, a coarse control logic 526, and a fine control logic 530. The duty cycle adjuster 520, the coarse logic 526, and the fine control logic 530 may be used to implement the duty cycle adjuster 220, the course control logic 526, and the fine control logic 530 of FIG. 2, respectively.

The duty cycle adjuster 520 may include a plurality of adjuster cells 550 that may be arranged in any number of rows and/or columns. The duty cycle adjuster 520 may for example, include 4 columns and 4 rows, or may include 8 columns and 8 rows. Each adjuster cell 550 of the first column may be configured to receive a clock signal, such as the INXCLK signal and the last column of the plurality of adjuster cells 550 may be configured to provide a duty cycle adjusted clock signal, such as the DCCCLK signal. Each adjuster cell 550 of each intermediate column may be coupled to the output of each adjuster cell 550 of the preceding column. Any number of rows of the adjuster cells 550 may be coupled to the coarse control logic 526 and/or the fine control logic 530. By way of example, in one embodiment, such as the embodiment illustrated in FIG. 5, each of the plurality of adjuster cells 550 may be coupled to the coarse control logic 526, and adjuster cells 550 located in the first and last rows may be coupled to the fine control logic 530. In another embodiment, first and second rows of the plurality of the adjuster cells 550 may be coupled to the fine control logic 530. In yet another embodiment, all rows of the adjuster cells 550 may be coupled to the fine control logic 530.

The coarse control logic 526 may be configured to selectively enable one or more of the adjuster cells 550 of the duty cycle adjuster 520 to which the coarse control logic 526 is coupled. In one embodiment, the coarse control logic 530 may be configured to enable a particular adjuster cell 550 by providing a respective control signal COARSE to the adjuster cells 550. As will be explained in more detail below, by enabling an adjuster cell 550, the rise and/or fall time of the INXCLK signal provided to the duty cycle adjuster 520 may be adjusted with a coarse adjustment, thereby adjusting the duty cycle of the INXCLK signal.

The fine control logic 530 may be configured to selectively enable one or more of the adjuster cells 550 of the duty cycle adjuster 520 to which the fine control logic is coupled. In one embodiment, the fine control logic may be configured to enable a particular adjuster cell 550 by providing a respective control signal FINE to the adjuster cell 550. By providing a FINE control signal in this manner, the rise and/or fall time of the INXCLK signal provided to the duty cycle adjuster 520 may be adjusted with a fine adjustment, thereby adjusting the duty cycle of the INXCLK signal.

In an example operation of the adjustment circuit 500, the coarse control logic 526 may be enabled by the recovery control logic 228 of FIG. 2 and implement the step 320 of FIG. 3 as described. The coarse control logic 526 may selectively enable one or more adjuster cells 550 to adjust the duty cycle of the INXCLK signal until an oscillation condition is achieved, or until no more coarse adjustments may be made, e.g., all adjuster cells 550 coupled to the coarse control logic 526 have been selectively enabled. The fine control logic 530 may be enabled by the recovery control logic 228 of FIG. 2 and in response may implement the step 335 of FIG. 3 as described. The fine control logic 530 may selectively enable one or more of the adjuster cells to adjust the duty cycle of the INXCLK signal until an oscillation condition is achieved, or until no more fine adjustments may be made, e.g., all adjuster cells 550 coupled to the fine control logic 530 have been selectively enabled.

Figure 6A:
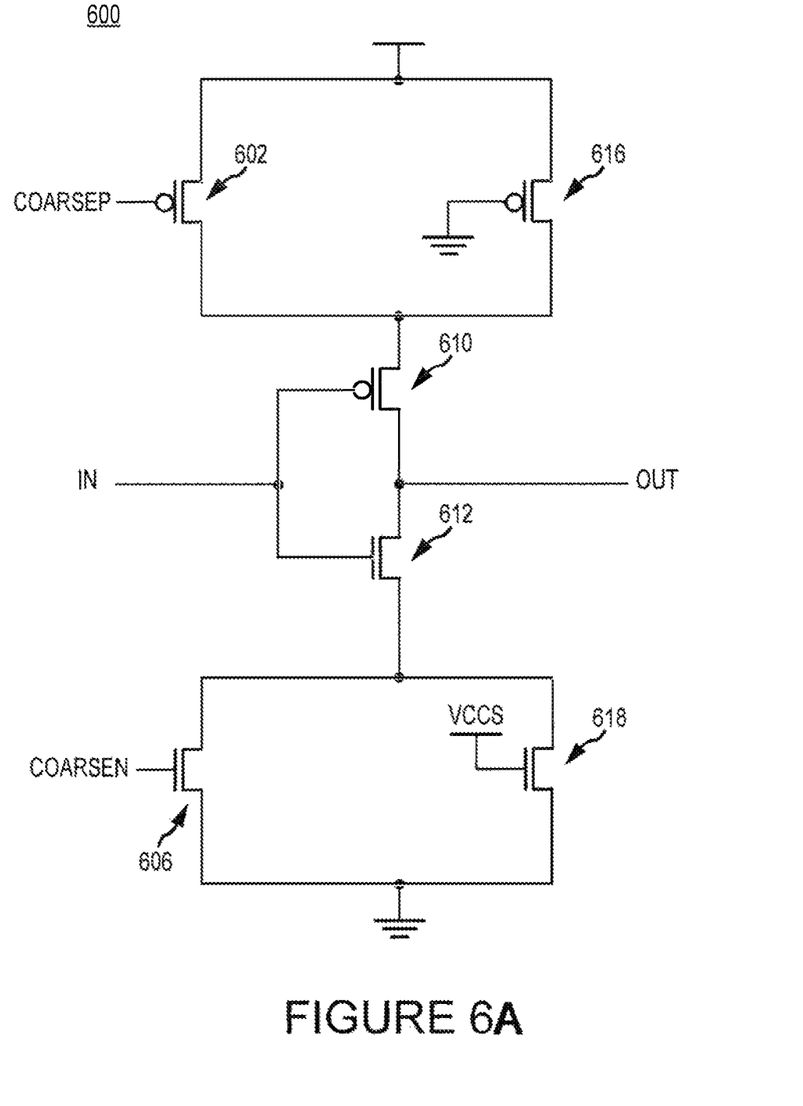
FIG. 6A is schematic diagram of an adjuster cell according to an embodiment of the invention.

FIG. 6A is schematic diagram of an adjuster cell 600 according to an embodiment of the invention. The adjuster cell 600 may be used to implement one or more of the adjuster cells 550 of FIG. 5, such as the adjuster cells 550 coupled to the coarse control logic 526. The adjuster cell 600 may include transistors 610, 612, 616, 618, which may be configured to operate as an inverter (e.g., CMOS inverter). For example, transistors 610 and 612 may be configured to receive a clock signal IN at their respective gates and provide a clock signal OUT having a logical state opposite of the clock signal N. Transistors 616 and 618, each coupled to a respective supply voltage node at a respective gate, may determine the basic drive strength of the CMOS inverter. This may, for instance, regulate step size linearity of the clock signal OUT.

The adjuster cell 600 may further include transistors 602, 606 that may be coupled in parallel to the transistors 616 and 618, respectively. The transistors 602, 606 may be configured to receive control signals COARSEP and COARSEN, respectively. The COARSEP signal may be provided by a coarse control logic, such as the coarse control logic 226 of FIG. 2 or the coarse control logic 526 of FIG. 5. The COARSEN signal may also be provided by the coarse control logic 226, 526, and generated using circuits known by those ordinarily skilled in the art, for example, an inverter circuit. In one embodiment, COARSEN may be the complement of COARSEP, and in other embodiments COARSEP and COARSEN may be independent of one another.

The transistors 602, 606 may each be configured to have any transistor dimensions, and further may be configured to have different transistor dimensions. In one embodiment, for example, using channel width of the transistors as an example of transistor dimensions, the ratio of channel widths between the transistors 602, 606 may be configured such that in response to the COARSEP and COARSEN signals, the drive strength of the adjuster cell 600 is adjusted. Adjusting the drive strength in this manner may, for instance, increase the rate at which the adjuster cell 600 may transition the OUT clock signal from a first logical state to a second logical state. Additionally or alternatively, adjusting the drive strength in this manner may decrease the rate at which the adjuster cell 600 may transition the OUT clock signal from the second logical state to the first logical state. As an example, the ratio of the transistors 602, 606 may be configured such that the rise time of the control signal OUT is increased and/or the fall time of the control signal OUT is decreased. Transistor 602 may have a larger channel width than the transistor 606 (e.g., twice the channel width), or may have a channel width such that the ratio between the channel widths of transistors 602, 606 is greater than 1 and less than 2. In other embodiments, the rise time may be decreased and/or the fall time increased. The ratio between the channel widths of the transistors 602, 606 may be configured such that the drive strength is adjusted by an amount that results in a coarse adjustment of the duty cycle of the clock signal IN. The drive strength of the adjuster cell 600 may further be based, at least in part, on the ratio of channel widths between transistors 602 and 616 and/or the ratio of channel widths between transistors 606 and 618. For example, in one embodiment, transistor 602 may have a larger channel width than transistor 616, and transistor 606 may have a larger channel width than transistor 618. In another embodiment, transistors 602 may have a smaller channel width than transistor 616, and transistor 606 may have a smaller channel width than transistor 618. Moreover, in some embodiments, the ratio of the channel widths of transistors 616, 618 may be the same ratio as the transistors 602, 606. Accordingly, the ratio between the channel widths of transistors 602, 616, and the ratio between the channel widths of transistors 606, 618 may be the same.

In operation, a clock signal IN may be provided to the adjuster cell 600. The clock signal IN may be the INXCLK signal and may be received from a clock signal generator, such as the clock signal generator 104 of FIG. 1, or may be a clock signal received from one or more adjuster cells coupled to an input of the adjuster cell 600. Responsive to the clock signal IN, the adjuster cell 600 may provide a clock signal OUT based, at least in part, on the clock signal IN. The adjuster cell 600 may receive the COARSEP and COARSEN signals at the gates of transistors 602, 606, for instance from the coarse control logic 526 of FIG. 5. In response, one or more of the transistors 602, 606 may be enabled. As previously described, enabling transistors 602, 606 may adjust the drive strength of the adjuster cell 600. This may, for instance, adjust the rise time and/or fall time of the clock signal OUT. As a result, the clock signal OUT may have a duty cycle differing from that of the clock signal IN. For example, in at least one embodiment, in response to the COARSEP and COARSEN signals, the adjuster cell 600 may adjust the duty cycle of the clock cycle such that the duty cycle of the clock signal OUT differs from the duty cycle of the clock signal IN by a coarse adjustment.

Figure 6B:
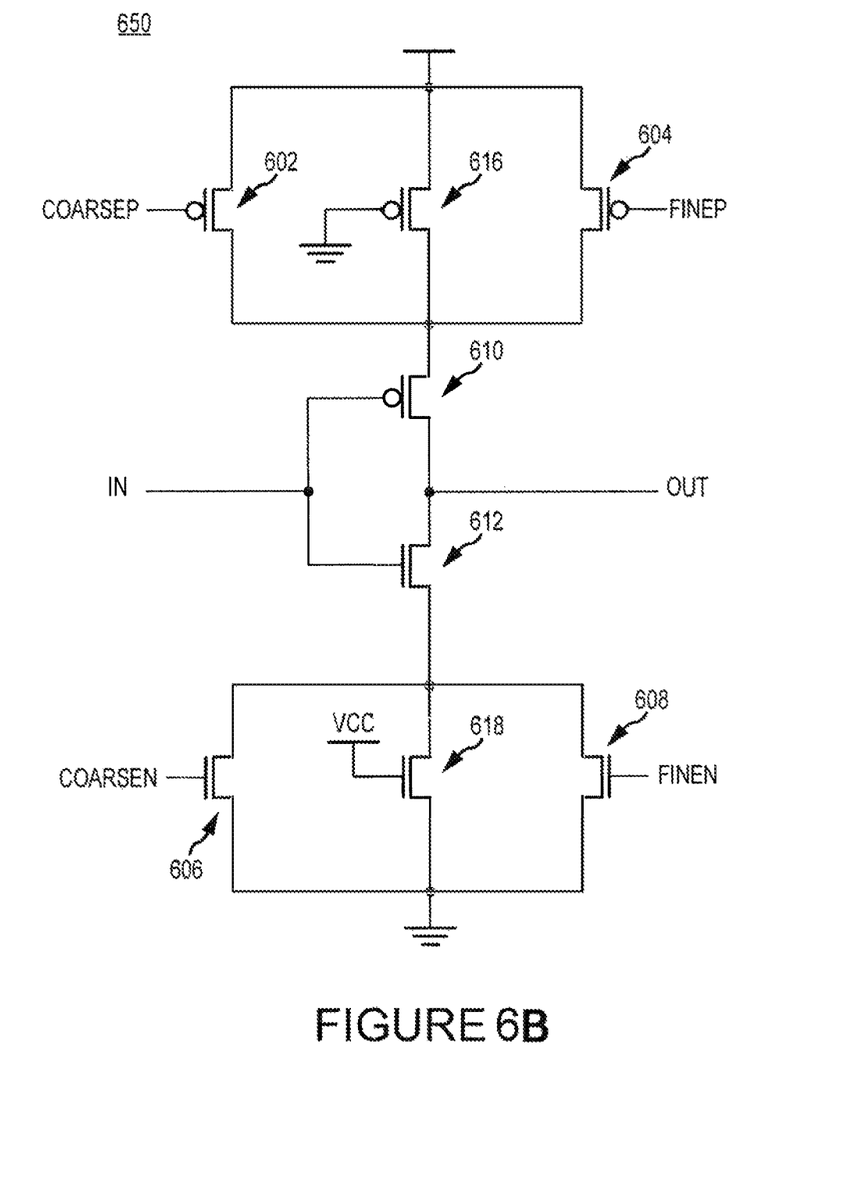
FIG. 6B is a schematic diagram of an adjuster cell according to an embodiment of the invention.

FIG. 6B is a schematic diagram of an adjuster cell 650 according to an embodiment of the invention. The adjustment cell 650 may be used to implement one or more of the adjuster cells 550 of FIG. 5. The adjuster cell 650 includes elements that have been previously described with respect to the adjuster cell of 600 of FIG. 6A. Those elements are shown in FIG. 6B using the same reference numbers used in FIG. 6A, and operation of the common elements is as previously described. Consequently, a detailed description of the operation of these elements will not be repeated in the interest of brevity.

The adjuster cell 650 may include transistors 604, 608 that may be coupled in parallel to the transistors 616 and 618, respectively. The transistors 604, 608 may be configured to receive control signals FINEP and FINEN. The FINEP signal, as previously described, may be provided by the fine control logic 230 of FIG. 2 or the fine control logic 530 of FIG. 5. The FINEN signal may also be provided by the fine control logic 230, 530, and generated using circuits known by those ordinarily skilled in the art, for example, an inverter circuit.

The transistors 604, 608 may each be configured to have any transistor dimensions, and further may be configured to have different transistor dimensions. In one embodiment, using channel width of the transistors as an example of transistor dimensions, for example, the ratio of channel widths between the transistors 604, 608 may be configured such that in response to the FINEP and FINEN signals, the drive strength of the adjuster cell 650 is adjusted. As described with reference to the adjuster cell 600, adjusting the drive strength in this manner may, for instance, increase the rate at which the adjuster cell 650 may transition the OUT clock signal from a first logical state to a second logical state and/or decrease the rate at which the adjuster cell 650 may transition the OUT clock signal from the second logical state to a first logical state. The ratio of channel widths of the transistors 604, 608 may be configured such that the drive strength is adjusted by an amount that results in a fine adjustment of the duty cycle of the clock signal IN. The transistor 604 may, for instance, have a larger channel width than the transistor 608. The drive strength of the adjuster cell 650 may further be based, at least in part, on the ratio of channel widths between transistors 604 and 616 and/or the ratio of channel widths between transistors 608 and 618.

In an example operation, the adjuster cell 650 may receive the FINEP and FINEN signals at the transistors 604, 608, for instance, from the fine control logic 530 of FIG. 5. In response, the transistors 604, 608 may be enabled. Enabling transistors 604, 608 in this manner may adjust the drive strength of the adjuster cell 650. This may, for instance, adjust the rise time and/or fall time of the clock signal OUT, and as a result, the clock signal OUT may have a duty cycle differing from that of the clock signal IN. Adjusting the drive strength in response to the FINEP and FINEN signals may adjust the duty cycle of the clock cycle such that the duty cycle of the clock signal OUT differs from the duty cycle of the clock signal IN by a fine adjustment.

While the drive strength of the adjuster cell 650 may be adjusted by a first amount responsive to the COARSEP and COARSEN signals and also may be adjusted by a second amount responsive to the FINEP and FINEN signals, in some embodiments, the adjuster cell 650 may simultaneously receive COARSEP, COARSEN, FINEP, and FINEN signals such that the drive strength is changed by an amount that is a combination of the first and second amounts. Accordingly, responsive to the COARSEN, COARSEN, FINEP, FINEN signals, the duty cycle of the clock signal IN may be adjusted with both a coarse adjustment and a fine adjustment.

While the adjuster cells 600 and 650 in FIGS. 6A and 6B, respectively, have been described with respect to adjusting a duty cycle, it will be appreciated that the adjuster cells 600 and 650 may additionally or alternatively be used to adjust (e.g., modify) the timing of a signal in other ways. For example, adjuster cells 600 and 650 may be included in a delay line, such as a delay line in a delay locked loop (DLL), to delay a signal. As another example, adjuster cells 600 and 650 may be used to buffer an input signal or an output signal or adjust jitter and/or skew or a signal.

Figure 7:
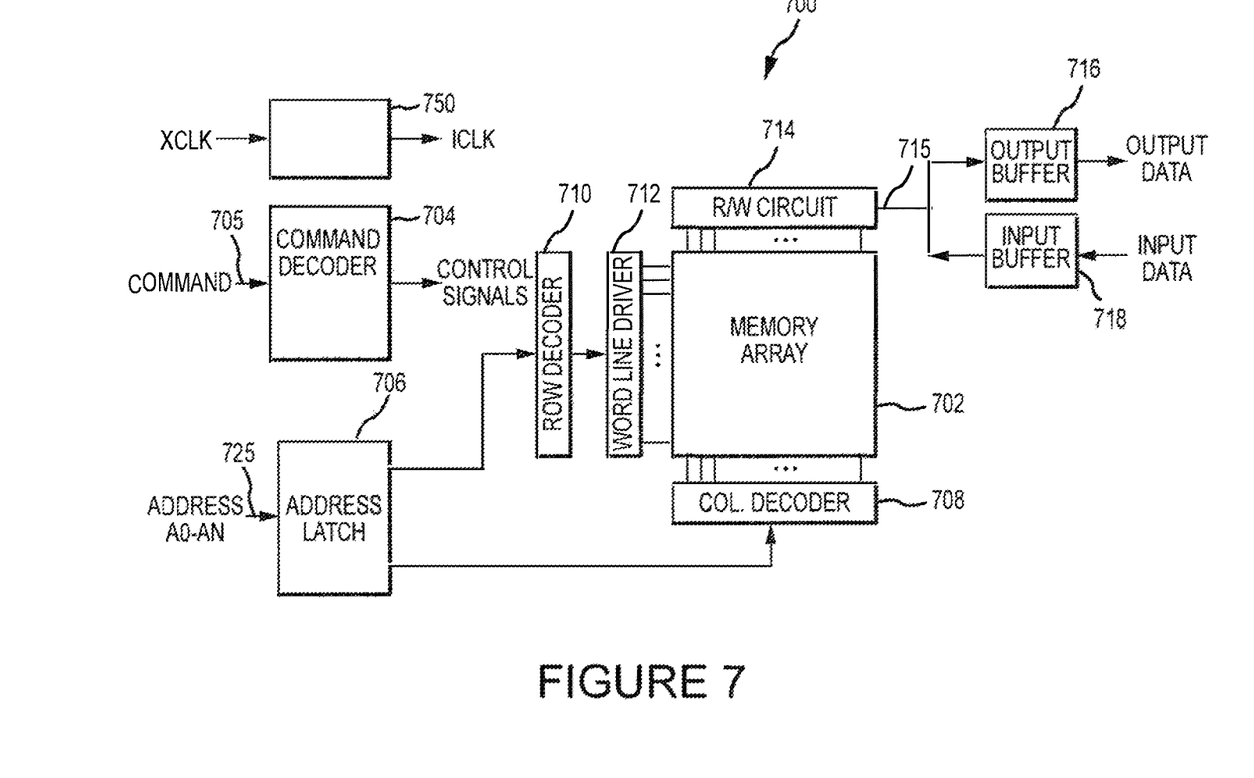
FIG. 7 is a block diagram of a portion of a memory according to an embodiment of the invention.

FIG. 7 is a schematic block diagram of a portion of a memory 700 according to an embodiment of the invention. The memory 700 includes an array 702 of memory cells, which may be, for example, DRAM memory cells, SRAM memory cells, flash memory cells, or some other types of memory cells. The memory 700 includes an address/command decoder 704 that receives memory commands and addresses through an ADDR/CMD bus. The address/command decoder 704 generates control signals, based on the commands received through the ADDR/CMD bus. The address/command decoder 704 also provides row and column addresses to the memory 700 through an address bus and an address latch 706. The address latch then outputs separate column addresses and separate row addresses.

The row and column addresses are provided by the address latch 706 to a row decoder 710 and a column decoder 708, respectively. The column decoder 708 selects lines extending through the array 702 corresponding to respective column addresses. The row address decoder 710 is connected to word line driver 712 that activates respective rows of memory cells in the array 702 corresponding to received row addresses. The selected line (e.g., a bit line or bit lines) corresponding to a received column address are coupled to a read/write circuitry 714 to provide read data to an output buffer 716 via an input-output data bus 715. Write data are provided to the memory array 702 through an input buffer 718 and the memory array read/write circuitry 714. The memory 700 may further include an apparatus 750 according to an embodiment of the invention. The apparatus 750 may be implemented using the apparatus 100 described above. The apparatus 750 is configured to receive an external clock signal and provide a duty cycle adjusted internal clock signal ICLK. The ICLK signal may be used for timing the operation of other circuits of the memory 700. In some embodiments, the ICLK is used to generate clock signals to clock the output buffers 716 and/or the input buffer 718. In other embodiments, the apparatus 750 or other apparatuses, such as those described herein, may be used to provide duty cycle adjusted clock signals for use in the memory 700.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus, comprising:
   a dynamic random access memory (DRAM) including:
      a duty cycle adjustment circuit configured to receive a signal, wherein, during a coarse adjustment selection operation, the duty cycle adjustment circuit is configured to select a coarse adjustment value to adjust a duty cycle of the signal by a coarse adjustment amount, wherein, after selection of the course adjustment value and during a fine adjustment selection operation, the duty cycle adjustment circuit is further configured to select a fine adjustment value to additionally adjust the duty cycle of the signal a fine adjustment amount to provide a duty cycle adjusted signal, wherein the duty cycle adjustment circuit comprises a first plurality of serially-coupled adjustor cells each configured to apply at least a portion of the fine adjustment amount and at least a portion of the coarse adjustment amount to the signal based on the fine adjustment value and the coarse adjustment value, respectively, wherein the duty cycle adjustment circuit further comprises a second plurality of serially-coupled adjustor cells each configured to selectively apply only a portion of the coarse adjustment amount to the signal based on the coarse adjustment value, wherein a first one of the first plurality of serially-coupled adjustor cells is configured to receive the signal simultaneous with receipt of the signal at a first one of the second of serially-coupled adjustor cells, wherein an adjustor cell of the first plurality of serially-coupled adjuster cells comprises a first transistor having a first size for providing a coarse adjustment and a second transistor having a second size for providing a fine adjustment, wherein the first size and the second size are different, wherein the duty cycle adjustment circuit is enabled by a control signal provided by a memory controller in communication with the DRAM.

2. The apparatus of claim 1, wherein, during a coarse adjustment selection operation, the duty cycle adjustment circuit is configured to determine whether the coarse adjustment value satisfies a coarse oscillation condition prior to selection of the fine adjustment value.

3. The apparatus of claim 2, wherein the coarse oscillation condition is satisfied when coarse adjustments produce an overshoot condition followed by an undershoot condition a threshold number of times.

4. The apparatus of claim 1, wherein the duty cycle adjustment circuit is configured to adjust the rise time of the signal or the fall time of the signal.

5. The apparatus of claim 1, wherein the adjustor cell includes an inverter.

6. The apparatus of claim 1, further comprising coarse adjustment logic coupled to each of the plurality of serially-coupled adjustor cells and configured to control the coarse adjustment value.

7. The apparatus of claim 6, further comprising fine adjustment logic coupled the plurality of serially-coupled adjustor cells and configured to control the fine adjustment value.

8. The apparatus of claim 1, further comprising a signal generator coupled to the duty cycle adjustment circuit and configured to receive an external signal, the signal generator further configured to delay the external signal to provide the signal to the duty cycle adjustment circuit.

9. A duty cycle adjustment circuit of a dynamic random access memory (DRAM), comprising:

an adjustment circuit, comprising a duty cycle adjuster comprising a plurality of adjustor cells, wherein the duty cycle adjustor is configured to receive a clock signal and to adjust a duty cycle of the clock signal using the plurality of adjustor cells to provide a duty cycle adjusted clock signal, wherein each of a first serially-coupled subset of the plurality of adjustor cells is configured to apply only a respective coarse adjustment to the duty cycle of the clock signal and each of a second serially-coupled subset of the plurality of adjustment cells non-overlapping with the first serially-coupled subset is configured to apply both a respective fine adjustment to the duty cycle of the clock signal and the respective coarse adjustment to the duty cycle of the clock signal, wherein a first one of the first serially-coupled subset of the plurality of adjustor cells is configured to receive the clock signal simultaneous with receipt of the clock signal at a first one of the second serially-coupled subset of the plurality of adjustor cells, wherein an adjustor cell of the second subset of the plurality of adjuster cells comprises a first transistor having a first size for providing a coarse adjustment and a second transistor having a second size for providing a fine adjustment, wherein the first size and the second size are different; and recovery control logic configured to enable sequential selection of coarse and fine adjustment values to apply to the clock signal by the duty cycle adjustor during a duty cycle adjustment selection operation, wherein the recovery control logic receives an enable signal from a memory controller in communication with the DRAM.

10. The duty cycle adjustment circuit of claim 9, further comprising a coarse adjustment control logic configured to control a coarse adjustment of the clock signal via any of the plurality of adjustor cells.

11. The duty cycle adjustment circuit of claim 9, further comprising fine control logic configured to control a fine adjustment of the clock signal via the second subset of the plurality of adjustor cells.

12. The duty cycle adjustment circuit of claim 9, further comprising a duty cycle detection circuit configured to detect a duty cycle error of the duty cycle adjusted clock signal, wherein a coarse adjustment and fine adjustment are based on the duty cycle error.

13. The duty cycle adjustment circuit of claim 9, wherein, during the duty cycle adjustment selection operation the duty cycle adjuster is configured to change a selected coarse adjustment value applied to the duty cycle of the clock signal until changes to the selected coarse adjustment applied to the duty cycle of the clock signal produce an overshoot condition followed by an undershoot condition a threshold number of times.

14. The duty cycle adjustment circuit of claim 9, wherein the plurality of adjuster cells each comprise an inverter.

15. A method, comprising:

receiving an enable signal from a memory controller at a duty cycle adjustment circuit of a dynamic random access memory (DRAM);

enabling the duty cycle adjustment circuit responsive to the enable signal;

receiving a clock signal at a duty cycle adjustor of the duty cycle adjustment circuit;

applying a coarse adjustment to the duty cycle of the clock signal based on a respective coarse adjustment value using an adjustor cell selected from a first serially-coupled subset of less than all of a plurality of adjustor cells of the duty cycle adjustor that are each configured to apply both a portion of the coarse adjustment and a portion of a fine adjustment to the duty cycle of the clock signal based on a respective fine adjustment value, wherein an adjustor cell of the first serially-coupled subset comprises a first transistor having a first size for providing a coarse adjustment and a second transistor having a second size for providing a fine adjustment, wherein the first size and the second size are different, wherein a second serially-coupled subset of the plurality of adjustor cells non-overlapping with the first subset are each only configured to apply the coarse adjustment, wherein a first one of the first serially-coupled subset of the plurality of adjustor cells is configured to receive the clock signal simultaneous with receipt of the clock signal at a first one of the second serially-coupled subset of the plurality of adjustor cells; and applying the fine adjustment of the duty cycle of the clock signal based on the respective fine adjustment value using at least the adjustor cell of the plurality of adjustor cells of the duty cycle adjustor; and during a duty cycle adjustment selection operation, selecting the respective fine adjustment value to apply to the clock signal to perform the fine adjustment of the duty cycle of the clock signal after completion of selection of the respective coarse adjustment value to apply to the clock signal to perform the coarse adjustment of the duty cycle of the clock signal.

16. The method of claim 15, further comprising receiving the fine adjustment of the duty cycle of the clock signal simultaneous with the coarse adjustment.

17. The method of claim 15, further comprising, during a duty cycle adjustment selection operation, ceasing changes to the respective coarse adjustment value in response to detection of an overshoot condition followed by an undershoot condition a threshold number of times.

* * * * *